(12) United States Patent
Wang et al.

(10) Patent No.: US 6,717,349 B2
(45) Date of Patent: Apr. 6, 2004

(54) PROCESS FOR THE PREPARATION OF PINK LIGHT-EMITTING DIODE WITH HIGH BRIGHTNESS

(75) Inventors: Chien-Yuan Wang, Kang-Shan (TW); Ru-Shi Liu, Chu-Tung (TW); R. K. Wu, Fong-Shan (TW); Wei-Tai Cheng, Kuai-Jen (TW)

(73) Assignee: Antex Industry Co., Ltd., Lin Yuan (TW)

( * ) Notice: Subject to any disclaimer, the term of this patent is extended or adjusted under 35 U.S.C. 154(b) by 74 days.

(21) Appl. No.: 10/037,582

(22) Filed: Jan. 4, 2002

(65) Prior Publication Data

US 2002/0180338 A1 Dec. 5, 2002

(30) Foreign Application Priority Data

May 29, 2001 (TW) .......................................... 090112911

(51) Int. Cl.⁷ ............................. H01J 1/62; H01J 63/04
(52) U.S. Cl. ...................................................... 313/483
(58) Field of Search ................................... 313/483, 461

(56) References Cited

U.S. PATENT DOCUMENTS 3,699,478 A  * 10/1972  Pinnow et al. .............. 359/305
6,509,651 B1 *  1/2003  Matsubara et al. ......... 257/100

* cited by examiner

*Primary Examiner*—Sandra O'Shea
*Assistant Examiner*—Sumati Kvishnan
(74) *Attorney, Agent, or Firm*—Ladas & Parry

(57) ABSTRACT

The subject invention relates to yttrium aluminum garnet fluorescent powders with formula $(Y_{3-x-y}Z_xEu_y)Al_5O_{12}$ or $(Y_3Z_xEu_y)Al_5O_{12}$, wherein $0<x\leq0.8$, $0<y\leq1.5$, and Z is selected from a group consisting of rare earth metals other than europium (Eu). The subject invention also relates to a pink light-emitting device, which comprises a light-emitting diodes as a luminescent element and a fluorescent body containing yttrium aluminum garnet fluorescent powders, wherein the diode emits a light with a wavelength ranging from 370 to 410 nm, which then excites the yttrium aluminum garnet fluorescent powders in the fluorescent body to emit another light with a wavelength ranging from 585 nm to 700 nm, so the two lights combine to produce a pink light. The subject invention also relates to the preparation of the yttrium aluminum garnet fluorescent powders.

10 Claims, 3 Drawing Sheets

PROCESS FOR THE PREPARATION OF PINK LIGHT-EMITTING DIODE WITH HIGH BRIGHTNESS

FIELD OF THE INVENTION

The present invention relates to yttrium aluminum garnet fluorescent powders comprising a rare earth metal other than europium (Eu). The present invention also relates to the preparation of the yttrium aluminum garnet fluorescent powders and their use in a light-emitting device, particularly in a pink light-emitting device with high brightness.

BACKGROUND OF THE INVENTION

Conventional fluorescent powders for use in pink light-emitting diodes are mainly produced by adding europium into crystal compounds (also named main lattice) such as $Y_3Al_5O_{12}$:$Eu^{3+}$ and $Y_2O_3$:$Eu^{3+}$. Among them, yttrium aluminum garnet (YAG) has better light-emitting efficiency. The colors, i.e., chromaticity diagrams, of fluorescent powders can be controlled by changing the added amounts of europium. However, the variation range of color that can be controlled is small. II other words, it is difficult to control the concentration of the single luminescence center to obtain the desired chromaticity diagram.

Accordingly, fluorescent powders for pink light-emitting diodes without the above drawbacks and processes for the preparation of the fluorescent powders are highly desired.

SUMMARY OF THE INVENTION

The object of the present invention is to provide yttrium aluminum garnet fluorescent powders with formula $(Y_{3-x-y}Z_xEu_y)Al_5O_{12}$ or $(Y_3Z_xEu_y)Al_5O_{12}$, wherein $0<x\leq0.8$, $0<y\leq1.5$, and Z is selected from a group consisting of rare earth metals other than europium (Eu).

Another object of the present invention is to provide a pink light-emitting device with high brightness, which comprises a visible or ultraviolet light-emitting diode as a luminescent element and a fluorescent body containing yttrium aluminum garnet fluorescent powders, wherein the diode emits a light with a wavelength ranging from 370 to 410 nm, and the light then excites the yttrium aluminum garnet fluorescent powders in the fluorescent body to emit another light with a wavelength ranging from 585 nm to 700 nm, so the two lights combine to produce a pink light with uniformly distributed colors.

Another object of the present invention is to provide a process for the preparation of the yttrium aluminum garnet fluorescent powders.

DETAILED DESCRIPTION OF THE INVENTION

Figure 1:
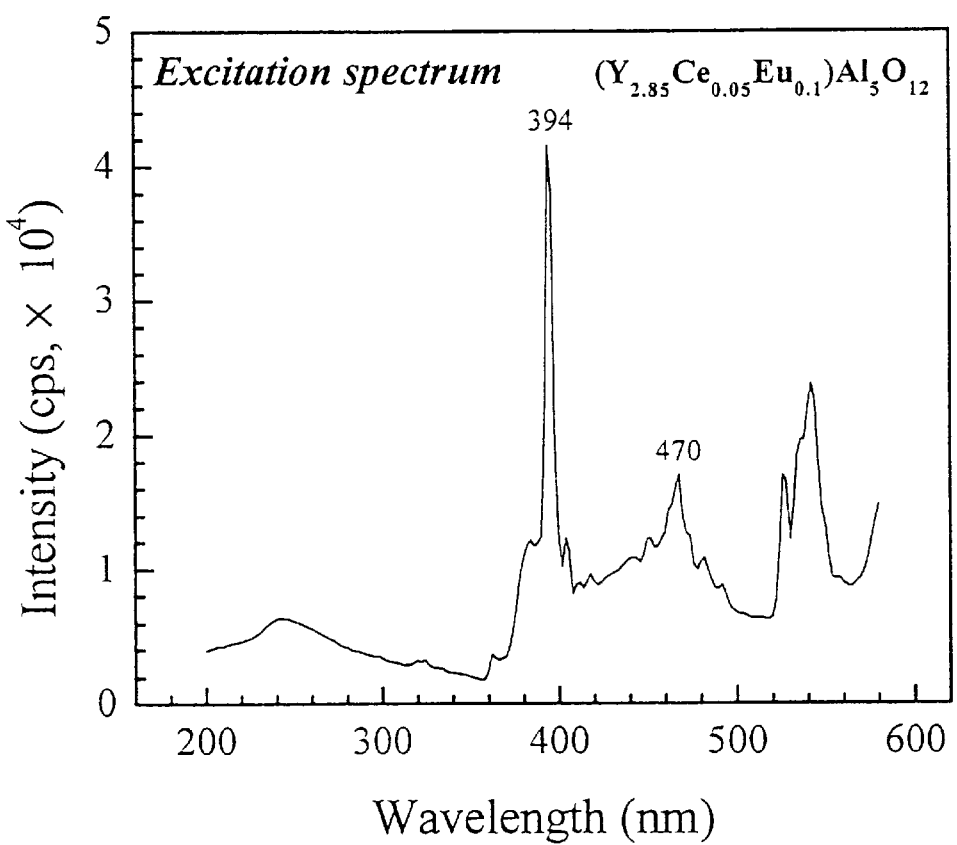
FIG. 1 shows a photoluminescence spectrum (detected at 600 nm) for the yttrium aluminum garnet fluorescent body of Example 3 with a formula $(Y_{2.85}Ce_{0.05}Eu_{0.1})Al_5O_{12}$.

By way of illustration and to provide a more complete appreciation of the present invention with many of the attendant advantages thereof, the following detailed description is given concerning yttrium aluminum garnet fluorescent powders, its preparation and its use in a light-emitting device.

The present invention relates to yttrium aluminum garnet fluorescent powders with formula $(Y_{3-x-y}Z_xEu_y)Al_5O_{12}$ or $(Y_3Z_xEu_y)Al_5O_{12}$, wherein $0<x\leq0.8$, $0<y\leq1.5$, and Z is selected from a group consisting of rare earth metals other than europium (Eu). The rare earth metals other than europium comprise cerium (Ce), praseodymium (Pr), neodymium (Nd), samarium (Sm), terbium (Tb), dysprosium (Dy), holmium (Ho), erbium (Er), thulium (Tm), ytterbium (Yb), and lutetium (Lu). Preferably, Z is cerium. Since the fluorescent powder contains at least two optically active centers (europium and a rare earth metal other than europium), it is possible to adjust the components of the composition or their ratios to obtain pink light having broader color spectrum as well as excellent light-emitting properties such as highly uniform color and high brightness. Specifically, as being excited by a light-emitting diode capable of emitting a visible or ultraviolet light with a wavelength ranging from 370 nm to 410 nm, the fluorescent powders of the present invention emit an orange-yellow to red light with a wavelength ranging from 585 nm to 700 nm.

The fluorescent powders of the invention can be produced by any conventional processes for the preparation of fluorescent powders. The processes include solid-state reaction processes and chemical synthesis processes. Among them, a solid-state reaction process includes the step of mixing metal-containing materials in desired ratios. The mixture is subjected to the treatments of grinding, pyrolysis, calcination, sintering, and reduction to produce fluorescent powders. However, the uniformity of the fluorescent powders thus obtained is poor and their particle sizes are large and not uniform. On the contrary, chemical synthesis processes provide fluorescent powders having desired purity, uniformity, and particle sizes. Hence, chemical synthesis processes, particularly gelation process and co-precipitation process, are preferred for the preparation of the fluorescent powders of the invention.

The gelation process for the preparation of the fluorescent powders of the invention comprises the steps of (1) grinding and homogeneously mixing water soluble compounds containing desired metals in ratios as those of the metals in the desired fluorescent powders to obtain a metal powder mixture, (2) dissolving the powder mixture in water to form an aqueous solution, (3) adding an appropriate amount of a chelating agent into the aqueous solution to chelate the metals in the aqueous solution, (4) adjusting the pH value of the aqueous solution to equal to or greater than 7 and converting the aqueous solution into a viscous liquid thereby, (5) pyrolyzing the viscous liquid to an ash, (6) calcining the ash, and (7) sintering the calcined ash.

The compounds used in step (1) can be any appropriate compounds, for example, the salts or organic compounds of the desired metals.

The water used in step (2) is preferably de-ionized water, more preferably secondary de-ionized water.

The chelating agent used in step (3) is an organic or inorganic compound which can form a chelate with the selected metals. Suitable chelating agents include, but are not limited to, organic acids, for example citric acid. The amount of the chelating agent is not critical to the present invention and can be appropriately selected.

In step (4), a base is added to the aqueous solution to adjust its pH value to be equal to or greater than 7, preferably equal to or greater than 10. The base can be an organic base, inorganic base and the like. Suitable organic bases include, but are not limited to, amines, for example, ethylenediamine. Suitable inorganic bases include, but are not limited to, ammonia liquor.

In step (4), after adjusting the pH value of the solution as desired, any appropriate manners can be used to accelerate the formation of a viscous liquid. For example, a heating treatment in combination with stirring can be used to accelerate the formation, wherein the heating temperature is preferably no higher than 120° C.

In step (5), the pyrolysis can be carried out in air. The selection of the pyrolysis temperature depends on the species of involved metals and the purpose that most of the organic substances and part of nitrogen oxides in the viscous liquid can be decomposed. Generally, the pyrolysis temperature is no higher than 400° C., for example, 300° C. A cooling step is optionally used to cool the viscous liquid to a gel prior to step (5).

The calcining in step (6) and sintering in step (7) are conventional in the art. Depending on the selected metals, skilled artisans can choose appropriate temperature, time and heating/cooling rate to practice the steps. For example, for the preparation of $(Y_{2.85}Ce_{0.05}Eu_{0.1})Al_5O_{12}$, the calcining temperature can be from 900° C. to 1200° C., such as 1000° C.; the sintering temperature can be from 1200° C. to 1600° C., such as 1500° C. Both the calcining and sintering can be carried out in air. The heating/cooling rate can be 1° C./min to 10° C./min, such as 5° C./min. The calcined ash of step (6) can be optionally grounded before step (7).

After step (7), the sintered powder can be optionally reduced in a reducing atmosphere at an elevated temperature. The reducing atmosphere can be any appropriate gas or gas mixture. For example, the reducing atmosphere can be a mixture of hydrogen and nitrogen in an optional ratio such as $H_2/N_2$ (5%/95%). The skilled artisans can select appropriate reduction temperature and time to practice the reduction. The reduction temperature typically ranges from 1300° C. to 1550° C., preferably 1500° C., and the reduction time typically ranges from 6 to 18 hours, such as 12 hours.

The co-precipitation process for the preparation of the fluorescent powder of the invention comprises the steps of (1) grinding and homogeneously mixing water soluble compounds containing desired metals in ratios as those in the desired fluorescent powders to obtain a metal powder mixture, (2) dissolving the powder mixture in water to form an aqueous solution, (3) adjusting the pH value of the aqueous solution to equal to or greater than 7 and converting the aqueous solution into a gel thereby, (4) pyrolyzing the gel to an ash, (5) calcining the ash, and (6) sintering the calcined ash.

The compounds used in step (1) can be any appropriate compounds, for example, the salts or organic compounds of the desired metals.

The water used in step (2) is preferably de-ionized water, more preferably secondary de-ionized water.

In step (3), a base is added to the aqueous solution to adjust its pH value to equal to or greater than 7, preferably equal to or greater than 10. The base can be an organic base, inorganic base and the like. Suitable organic bases include, but are not limited to, amines, for example, ethylenediamine. Suitable inorganic bases include, but are not limited to, ammonia liquor.

In step (3), after adjusting the pH value of the solution as desired, any appropriate manners such as mixing can be used to accelerate the gel formation. A filtration operation optionally in combination with suction can facilitate the formation of gel.

In step (4), the pyrolysis can be carried out in air. The selection of the pyrolysis temperature depends on the species of involved metals and the purpose that most organic substances and part of nitrogen oxides in the viscous liquid can be decomposed. Generally, the pyrolysis temperature is no higher than 400° C., for example, 300° C.

The calcined ash obtained in step (5) can be optionally ground prior to step (6).

The calcining in step (5) and sintering in step (6) are conventional in the art. Depending on the selected metals, skilled artisans can choose appropriate temperature, time and heating/cooling rate to practice the steps. For example, for the preparation of $(Y_{2.85}Ce_{0.05}Eu_{0.1})Al_5O_2$, the calcining temperature can be from 900° C. to 1200° C., such as 1000° C.; the sintering temperature can be from 1200° C. to 1600° C., such as 1500° C. Both the calcining and sintering can be carried out in air. The heating/cooling rate can be between 1° C./min and 10° C./min, such as 5° C./min.

After step (6), the sintered powder can be optionally reduced in a reducing atmosphere at an elevated temperature. The reducing atmosphere can be any appropriate gas or gas mixture. For example, the reducing atmosphere can be a mixture of hydrogen and nitrogen in an optionally selected ratio such as $H_2/N_2$ (5%/95%). The skilled artisans can select appropriate reduction temperature and time to practice the reduction. The reduction temperature typically ranges from 1300° C. to 1550° C., such as 1500° C., and the reduction time typically ranges from 6 to 18 hours, such as 12 hours.

By adjusting the composition of the metal powder mixture in step (1), the gelation process and co-precipitation process can be used to produce any desired fluorescent powders of the invention. The products thus obtained have finer and more uniform particles in comparison with those prepared by solid-state reaction processes.

The present invention also relates to a pink light-emitting device with high brightness, which comprises visible or ultraviolet light-emitting diodes as a luminescent element and a fluorescent body containing yttrium aluminum garnet fluorescent powders with formula $(Y_{3-x-y}Z_xEu_y)Al_5O_{12}$ or $(Y_3Z_xEu_y)Al_5O_{12}$, wherein $0<x\leq0.8$, $0<y\leq1.5$, and Z is selected from a group consisting of rare earth metals other than europium (Eu). The rare earth metals other than europium comprise cerium (Ce), praseodymium (Pr), neodymium (Nd), samarium (Sm), terbium (Tb), dysprosium (Dy), holmium (Ho), erbium (Er), thulium (Tm), ytterbium (Yb), and lutetium (Lu).

In the pink light-emitting device with high brightness of the invention, a light-emitting diode emits a visible or ultraviolet light with a wavelength ranging from 370 um to 410 nm, wherein the light excites the yttrium aluminum garnet fluorescent powders to emits an orange-yellow to red light with a wavelength ranging from 585 nm to 700 nm. The above two lights combine to produce a pink light.

For example, in a fluorescent body produced from yttrium aluminum garnet fluorescent powders containing cerium and europium, the fluorescent body is excited by a light-emitting diode, which emits a visible or ultraviolet light with a wavelength ranging from 370 nm to 410 nm, to emit an orange-yellow to red light with a wavelength ranging from 585 nm to 700 nm. The visible or ultraviolet light combines with the orange-yellow or red light to provide a pink light with uniformly distributed colors and its brightness is higher than that provided by a fluorescent body from fluorescent powders only containing europium but not cerium. For testing the optical properties of fluroscent materials, a photoluminescence spectrometer is used to conduct the scan of the luminescence spectrum of a fluorescent body, and then a luminescence wavelength for scanning the emission spectra is determined based on the luminescence spectrum. The yttrium aluminum garnet fluorescent body of the invention comprising at least two optically active centers is susceptible to be excited by a visible or ultraviolet light with wavelength ranging from 370 nm to 410 nm to emit an orange-yellow to red light with a wavelength ranging from 585 nm to 700 nm. When looking at the fluorescent body, one can sense a pink light with high brightness. This is because when visual nerves are stimulated simultaneously by two lights with different wavelengths, one can sense a new color different from those of the light sources. The chromaticity of the color, expressed as (x,y), can be calculated from the relative strength of light in view of the line drawn between two chromaticities of the wavelengths of original lights. Therefore, by utilizing conventional technology, the fluorescent powders of the invention can be supported or fixed by an appropriate material to form a fluorescent body. The fluorescent body associated with a light-emitting diode as a light source for emitting a wavelength ranging from 370 nm to 410 nm can be applied with an appropriate current to provide a pink light-emitting diode with excellent light-emitting properties.

Figure 2:
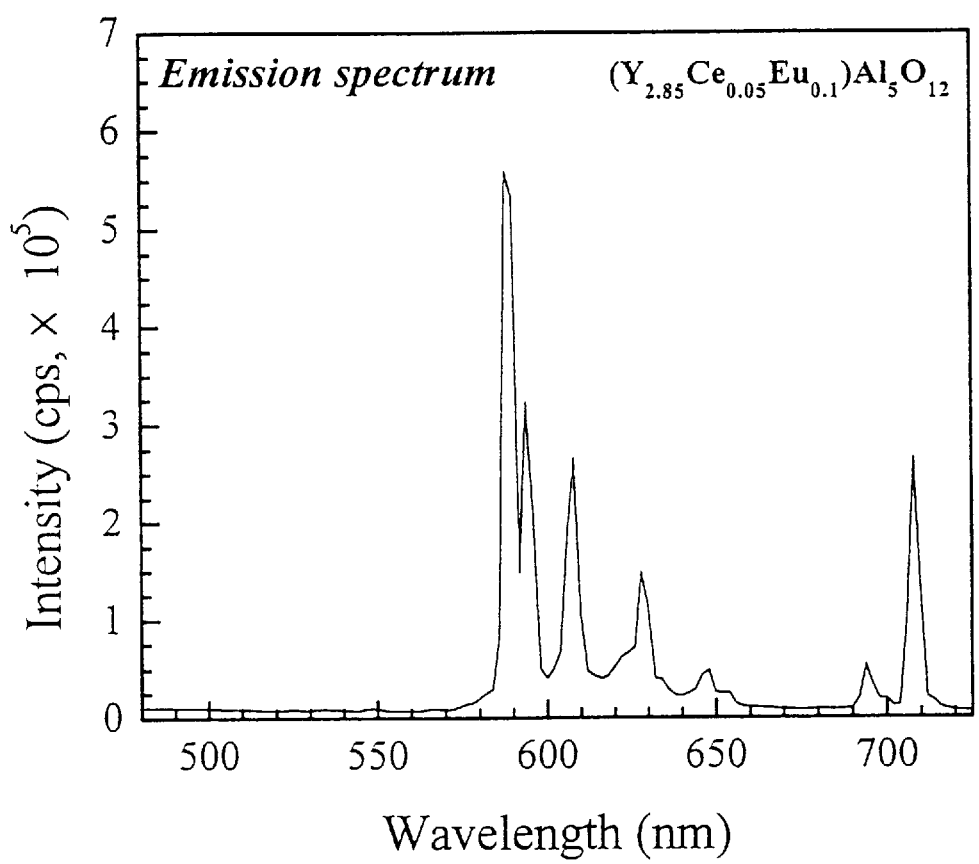
FIG. 2 shows an emission spectrum, excited by a wavelength of 394 nm, of the fluorescent body of Example 3 with a formula $(Y_{2.85}Ce_{0.05}Eu_{0.1})Al_5O_{12}$.
Figure 3:
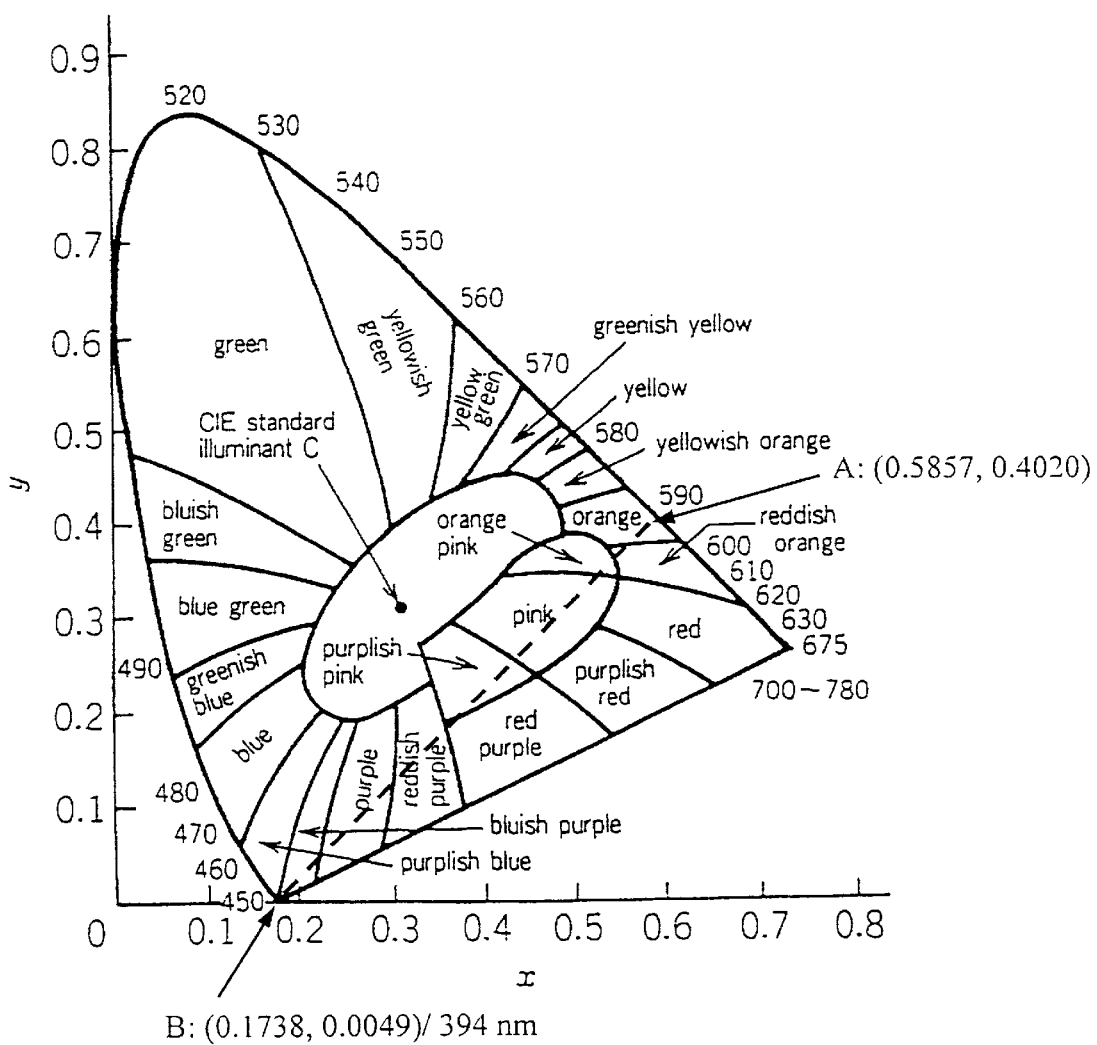
FIG. 3 shows that a dashed line, drawn from the chromaticity of point A (calculated from the emission spectrum of FIG. 2) a fluorescent body to that of point B representing a light with wavelength of 394 nm, passes the pink area in the Chromaticity diagram.

Referring to FIG. 1, the photoluminescence spectrum (detected at 600 nm) of an yttrium aluminum garnet fluorescent body of Example 3 with formula $(Y_{2.85}Ce_{0.05}Eu_{0.1})Al_5O_{12}$ produced by a co-precipitation process is provided. According to the luminescence spectra, an ultraviolet light with a wavelength of 394 nm is determined to be used to scan the emission spectra. FIG. 2 is the emission spectrum of the fluorescent body having a formula $(Y_{2.85}Ce_{0.05}Eu_{0.1})Al_5O_{12}$ excited by a light with a wavelength of 394 nm. The data of the luminescence spectra are converted to corresponding chromaticity of the fluorescent body by the converting formula of Chromaticity diagram ruled by Commission Internationale de l'Eclairage (CIE) in 1931. The chromaticity (0.5857, 0.4020) of fluorescent body and the chromaticity (0.1738, 0.0049) of a light with a wavelength of 394 nm are respectively marked as points A and B, and a dashed line is drawn between points A and B. As shown in FIG. 3, the dashed line between points A and B passes the pink area in the Chromaticity diagram. In other words, according to the principle of the combination of colors and lights, when visual nerves are simultaneously stimulated by a light with a wavelength of 394 nm and a reddish orange light (point A); a pink vision is generated. Hence, a pink light-emitting diode with excellent light-emitting properties can be produced by mixing the fluorescent powders of the invention and suitable materials in appropriate proportion, utilizing an ultraviolet light-emitting diode as a light source for emitting an appropriate wavelength (394±5 nm), properly packaging the mixture and diode, and applying a proper current.

The following examples are provided to further explain the invention from which the artisans can further appreciate the invention. However, the examples should not be considered as a limitation to the scope of the invention.

EXAMPLE 1

Solid-State Reaction Process

To provide a formulation of $(Y_{2.85}Ce_{0.05}Eu_{0.1})Al_5O_{12}$:[Y$(NO_3)_3 \cdot 6H_2O$] (2.6574 g), [Al$(NO_3)_3 \cdot 9H_2O$] (4.5662 g), [Ce$(NO_3)_3 \cdot 6H_2O$] (0.0529 g) and (Eu$_2O_3$) (0.0857 g) were stoichiometrically mixed. The raw material mixture was ground and homogeneously mixed to form a powder mixture. The powder mixture was put in a crucible and heated in air to 1000° C. at a heating rate of 5° C./min to effect calcination. After 24 hours, the powder was cooled to room temperature at a cooling rate of 5° C./min.

The calcinated powders were put in a crucible and sintered in air at 1500° C. for 24 hours. The heating rate and cooling rate of the sintering step were 5° C./min.

The sintered powders were optionally reduced in a reducing atmosphere of $H_2/N_2$ (5%/95%) at 1500° C. for 12 hours.

EXAMPLE 2

Gelation Process

To provide a formulation of $(Y_{2.85}Ce_{0.05}Eu_{0.1})Al_5O_{12}$:[Y$(NO_3)_3 \cdot 6H_2O$] (2.6574 g), [Al$(NO_3)_3 \cdot 9H_2O$] (4.5662 g), [Ce$(NO_3)_3 \cdot 6H_2O$] (0.0529 g) and [Eu$(NO_3)_3 \cdot 5H_2O$] (0.1042 g) were stoichiometrically mixed. The salt mixture was dissolved in secondary de-ionized water to form an aqueous solution.

Citric acid, as a chelating agent, was added to the aqueous solution in molars the same as those of the metal ions in the aqueous solution.

A base such as ammonia liquor or ethylenediamine was added to the aqueous solution to adjust the pH value of the aqueous solution to 10.5.

The aqueous solution was heated at 100 to 120° C. to form a viscous liquid.

The viscous liquid was cooled to form a gel. The gel was heated at 300° C. to decompose most of the organic substance and part of nitrogen oxide in the gel to provide a dark blown ash.

The ash was put in a crucible and heated in air to 1000° C. at a heating rate of 5° C./min to 1000° C. to effect calcinations to form powders. After 24 hours, the powders were cooled to room temperature with a cooling rate of 5° C./min.

The calcinated powders were put in a crucible and sintered in air at 1500° C. for 24 hours. The heating rate and cooling rate during the sintering step were 5° C./min.

The sintered powders were optionally reduced in a reducing atmosphere of $H_2/N_2$ (5%/95%) at 1500° C. for 12 hours.

EXAMPLE 3

Co-Precipitation Process

To provide a formulation of $(Y_{2.85}Ce_{0.05}Eu_{0.1})Al_5O_{12}$:[Y$(NO_3)_3 \cdot 6H_2O$] (2.6574 g), [Al$(NO_3)_3 \cdot 9H_2O$] (4.5662 g), [Ce$(NO_3)_3 \cdot 6H_2O$] (0.0529 g) and [Eu$(NO_3)_3 \cdot 5H_2O$] (0.1042 g) were stoichiometrically mixed. The salt mixture was dissolved in secondary de-ionized water to form an aqueous solution.

A base such as ammonia liquor or ethylenediamine was added to the aqueous solution to adjust the pH value of the aqueous solution to 10.5.

The solution was stirred to form a gel solution and then filtered with suction to provide a white gel.

The white gel was heated in air at 300° C. to decompose most of the organic substance and part of nitrogen oxide in the gel to provide a dark brown ash.

The ash was put in a crucible and heated in air to 1000° C. at a heating rate of 5° C./min to effect calcinations to form powders. After 24 hours, the powders were cooled to room temperature at a cooling rate of 5° C./min.

The calcinated powders were put in a crucible and sintered in air at 1500° C. for 24 hours. The heating rate and cooling rate during the sintering step were 5° C./min.

The sintered powders were optionally reduced in a reducing atmosphere of $H_2/N_2$ (5%/95%) at 1500° C. for 12 hours.

The fluorescent bodies obtained in the aforementioned examples were cooled to room temperature and ground by mortar in a crucible. The fluorescent bodies were tested by a photoluminescence spectrometer to determine their luminescence properties.

The present invention may, of course, be carried out in other specific ways than those herein set forth without departing from the spirit and essential characteristics of the present invention. The present embodiments are, therefore, to be considered in all respects as an illustration and are not restrictive. Therefore, any changes coming within fluorescent bodies produced from a yttrium aluminum garnet having at least two optical centers in the main lattice to provide excellent light-emitting properties such as a high uniformity in color and high brightness are to be embraced therein.

What is claimed is:

1. A yttrium aluminum garnet fluorescent powder with formula $(Y_{3-x-y}Z_xEu_y)Al_5O_{12}$ or $(Y_3Z_xEu_y)Al_5O_{12}$, wherein $0<x\leq0.8$, $0<y\leq1.5$, and Z is selected from a group consisting of rare earth metals other than europium (Eu).

2. A yttrium aluminum garnet fluorescent powder according to claim 1, wherein said rare earth metal other than europium is cerium (Ce), praseodymium (Pr), neodymium (Nd), samarium (Sm), terbium (Tb), dysprosium (Dy), holmium (Ho), erbium (Er), thulium (Tm), ytterbium (Yb), or lutetium (Lu).

3. A yttrium aluminum garnet fluorescent powder according to claim 1, wherein Z is Cerium.

4. A yttrium aluminum garnet fluorescent powder according to claim 1, wherein said fluorescent powder is excited by a visible or ultraviolet light with a wavelength ranging from 370 nm to 410 nm to emit an orange-yellow to red light with a wavelength ranging from 585 nm to 700 um.

5. A yttrium aluminum garnet fluorescent powder according to claim 1 for use in the manufacture of a pink light-emitting diode.

6. A pink light-emitting device with high brightness comprising visible or ultraviolet light-emitting diodes as a luminescent element and a fluorescent body comprising yttrium aluminum garnet fluorescent powders with formula $(Y_{3-x-y}Z_xEu_y)Al_5O_{12}$ or $(Y_3Z_xEu_y)Al_5O_{12}$, wherein $0<x\leq0.8$, $0<y\leq1.5$, and Z is selected from a group consisting of rare earth metals other than europium (Eu).

7. A pink light-emitting device according to claim 6, wherein said rare earth metal other than europium is cerium (Ce), praseodymium (Pr), neodymium (Nd), samarium (Sm), terbium (Tb), dysprosium (Dy), holmium (Ho), erbium (Er), thulium (Tm), ytterbium (Yb), or lutetium (Lu).

8. A pink light-emitting device according to claim 6, wherein Z is cerium (Ce).

9. A pink light-emitting device according to claim 6, wherein said light-emitting element emits a visible or ultraviolet light with a wavelength ranging from 370 nm to 410 nm.

10. A pink light-emitting device according to claim 6, wherein said fluorescent powder is excited by a visible or ultraviolet light and emits orange-yellow to red light with a wavelength ranging from 585 nm to 700 nm.

* * * * *

UNITED STATES PATENT AND TRADEMARK OFFICE
CERTIFICATE OF CORRECTION

PATENT NO. : 6,717,349 B2
DATED : April 6, 2004
INVENTOR(S) : Chien-Yuang Wang et al.

It is certified that error appears in the above-identified patent and that said Letters Patent is hereby corrected as shown below:

<u>Title page,</u>
Item [73], Assignee, "Antex" should read -- Nantex --.

Signed and Sealed this

Twenty-ninth Day of June, 2004

JON W. DUDAS
*Acting Director of the United States Patent and Trademark Office*